United States Patent
Lin et al.

(10) Patent No.: US 9,498,851 B2
(45) Date of Patent: Nov. 22, 2016

(54) METHODS FOR FORMING APPARATUS FOR STUD BUMP FORMATION

(71) Applicant: Taiwan Semiconductor Manufacturing Company, Ltd., Hsin-Chu (TW)

(72) Inventors: Yeong-Jyh Lin, Caotun Township (TW); Hsin-Hung Liao, Taipei (TW); Chien Ling Hwang, Hsin-Chu (TW); Yi-Li Hsiao, Hsin-Chu (TW); Chung-Shi Liu, Hsin-Chu (TW); Mirng-Ji Lii, Sinpu Township (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/574,593

(22) Filed: Dec. 18, 2014

(65) Prior Publication Data
US 2015/0102091 A1   Apr. 16, 2015

Related U.S. Application Data

(60) Division of application No. 13/960,576, filed on Aug. 6, 2013, now Pat. No. 8,936,730, which is a continuation of application No. 13/605,403, filed on Sep. 6, 2012, now Pat. No. 8,540,136.

(51) Int. Cl.
*B23K 31/02* (2006.01)
*B23K 20/00* (2006.01)
*B21D 53/36* (2006.01)

(52) U.S. Cl.
CPC ............... *B23K 31/02* (2013.01); *B21D 53/36* (2013.01); *B23K 20/007* (2013.01); *H01L 2224/78301* (2013.01); *Y10T 29/49* (2015.01)

(58) Field of Classification Search
None
See application file for complete search history.

(56) References Cited

U.S. PATENT DOCUMENTS 2,208,835 A * 5/1937 Donovan
3,156,514 A * 11/1964 Wing et al.
(Continued)

FOREIGN PATENT DOCUMENTS

DE  10114652 A1 * 6/2002
EP  06-71237 A * 9/1995
(Continued)

OTHER PUBLICATIONS

Translation of JP 01-225340A (no date available).*
(Continued)

*Primary Examiner* — Kiley Stoner
(74) *Attorney, Agent, or Firm* — Slater Matsil, LLP

(57) ABSTRACT

An apparatus used for forming stud bumps may be formed by providing a first clamp plate comprising a clamping surface, forming a notcher on the clamping surface, and forming a contact stopper on the clamping surface. The apparatus may include a clamp that includes at least two opposing plates, and at least one of the opposing plates includes a protruding feature that intersects the wire when the wire is clamped forming a first notch in the wire. The method for forming stud bumps includes bonding wire to a bonding surface, releasing the wire from the clamp, passing the wire a notch pitch distance through the clamp, clamping the wire with the clamp forming a second notch in the wire, and breaking the wire leaving a bonded portion of the wire on the bonding surface.

20 Claims, 8 Drawing Sheets

(56) References Cited

U.S. PATENT DOCUMENTS

| | | | |
|---|---|---|---|
| 3,321,606 A | | 5/1967 | Cropp et al. |
| 3,541,296 A | * | 11/1970 | Rudd |
| 3,643,321 A | * | 2/1972 | Field ................. H01L 24/85 228/180.5 |
| 3,671,710 A | * | 6/1972 | Coombs |
| 4,159,413 A | * | 6/1979 | Rosenstock et al. |
| 4,266,710 A | | 5/1981 | Bilane et al. |
| 4,653,681 A | * | 3/1987 | Dreibelbis ........... B23K 20/005 228/102 |
| 4,781,319 A | * | 11/1988 | Deubzer ............. B23K 20/005 228/1.1 |
| 4,955,523 A | | 9/1990 | Calomagno et al. |
| 4,998,002 A | * | 3/1991 | Okikawa ............. B23K 20/007 219/56.22 |
| 5,031,821 A | * | 7/1991 | Kaneda ............... B23K 20/007 228/110.1 |
| 5,101,263 A | * | 3/1992 | Kitano ................ H01L 24/85 257/734 |
| 5,152,450 A | * | 10/1992 | Okikawa ............. B23K 20/007 228/180.5 |
| 5,169,050 A | | 12/1992 | Montagu |
| 5,234,155 A | | 8/1993 | Takahashi et al. |
| 5,277,355 A | * | 1/1994 | Weaver ............... B23K 20/004 228/4.5 |
| 5,285,949 A | * | 2/1994 | Okikawa ............. B23K 20/007 228/179.1 |
| 5,395,038 A | * | 3/1995 | Olson ................. B23K 20/10 228/1.1 |
| 5,891,796 A | | 4/1999 | Nakamura et al. |
| 5,901,896 A | * | 5/1999 | Gal ................... H01L 21/67138 228/180.5 |
| 5,928,144 A | | 7/1999 | Real |
| 6,213,382 B1 | | 4/2001 | Akimoto |
| 6,282,780 B1 | | 9/2001 | Waki et al. |
| 6,568,580 B2 | | 5/2003 | Narita et al. |
| 6,708,403 B2 | | 3/2004 | Beaman et al. |
| 7,137,547 B2 | | 11/2006 | Wakefield |
| 7,227,095 B2 | | 6/2007 | Roberts et al. |
| 7,268,421 B1 | | 9/2007 | Lin |
| 7,578,422 B2 | | 8/2009 | Lange et al. |
| 7,750,483 B1 | | 7/2010 | Lin et al. |
| 2001/0002607 A1 | | 6/2001 | Sugiura et al. |
| 2002/0007957 A1 | | 1/2002 | Murai et al. |
| 2004/0098854 A1 | * | 5/2004 | Schmitt |
| 2004/0232203 A1 | | 11/2004 | Gaunekar et al. |
| 2005/0279805 A1 | | 12/2005 | Wong et al. |
| 2007/0187467 A1 | | 8/2007 | Toyama et al. |
| 2007/0271781 A9 | | 11/2007 | Beaman et al. |
| 2008/0000946 A1 | | 1/2008 | Kwan et al. |
| 2008/0217768 A1 | | 9/2008 | Miranda et al. |
| 2009/0188968 A1 | * | 7/2009 | Marie |
| 2009/0208772 A1 | * | 8/2009 | Khakhalev |
| 2010/0115881 A1 | * | 5/2010 | Inose et al. |
| 2011/0253691 A1 | * | 10/2011 | Kodama et al. |
| 2012/0017742 A1 | * | 1/2012 | Balint |
| 2012/0132695 A1 | * | 5/2012 | Zhang ................. B23K 20/005 228/44.3 |
| 2013/0167373 A1 | * | 7/2013 | Hwang ................ H01L 24/11 29/879 |

FOREIGN PATENT DOCUMENTS

| | | | | |
|---|---|---|---|---|
| JP | 62-077177 A | * | 4/1987 | |
| JP | 62-156080 A | * | 7/1987 | |
| JP | 62152143 | | 7/1987 | |
| JP | 01225340 | | 9/1989 | |
| JP | 01-273680 A | * | 11/1989 | |
| JP | 06031438 | | 2/1994 | |
| JP | 06-320298 A | * | 11/1994 | |

OTHER PUBLICATIONS

Madou, M., "Fundamentals of Microfabrication," CRC Press, 1997, p. 265.

Williams, K.R., et al., "Etch Rate for Micromatching Processing," Journal of Microelectromechanical System, vol. 5, 1996, pp. 256-269.

* cited by examiner

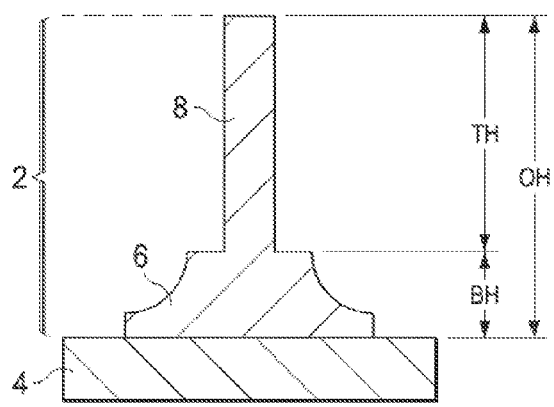
FIG. 1
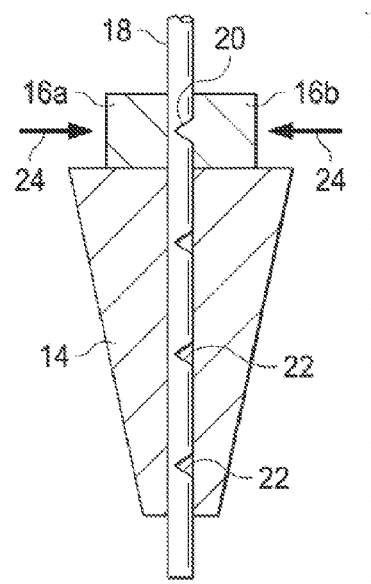
FIG. 2A
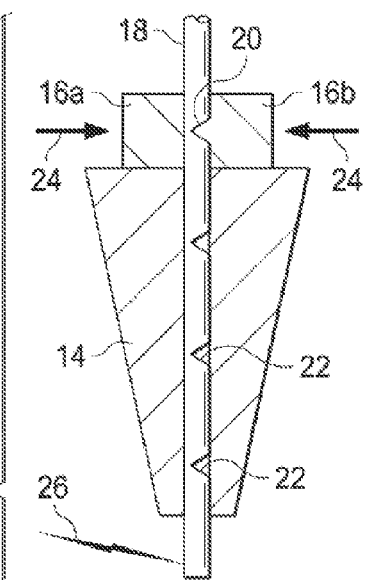
FIG. 2B
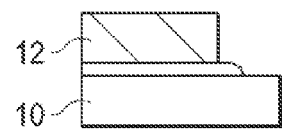
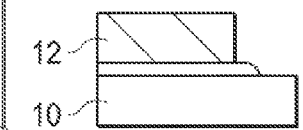

METHODS FOR FORMING APPARATUS FOR STUD BUMP FORMATION

This application is a divisional of U.S. patent application Ser. No. 13/960,576, filed on Aug. 6, 2013, entitled "Methods for Forming Apparatus for Stud Bump Formation," which is a continuation of U.S. patent application Ser. No. 13/605,403, filed on Sep. 6, 2012, entitled "Methods for Stud Bump Formation and Apparatus for Performing the Same," which applications are hereby incorporated herein by reference in their entireties.

BACKGROUND

As integrated circuit device density increases, the need for improved packaging schemes also increases. For example, when the densities of the integrated circuit device increase, the densities of the respective connectors, such as bond pads, copper bumps, wire bonds, solder joints, and the like, also increase. The increased densities result in stricter requirements to the bonding processes. The sizes of the solder bumps need to be reduced without sacrificing the quality of the resulting solder-containing bonds.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 1 is a stud bump having a bump region and a tail region according to an embodiment;

FIGS. 2A through 2F are a wire bonding stud bumping process that allows for tail height control according to an embodiment;

DETAILED DESCRIPTION OF ILLUSTRATIVE EMBODIMENTS

Figure 2C:
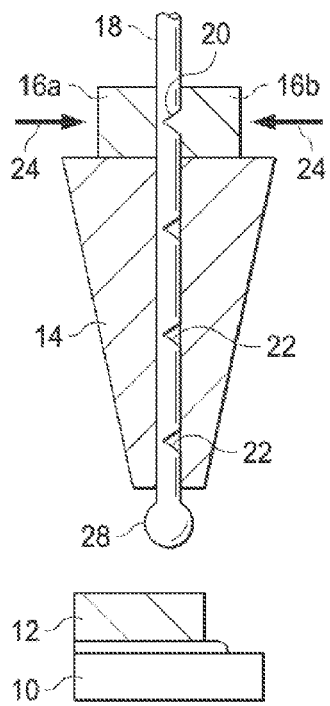

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Wire bonding stud bumps and methods of forming the same are provided in accordance with various embodiments. Intermediate stages of forming the stud bumps are illustrated. Apparatuses for forming stud bumps are described according to embodiments and methods of forming example apparatuses. Variations and operations of embodiments are discussed, although other variations and operations are contemplated by other embodiments. As one example, methods disclosed herein may be described as being performed in a particular order, but other embodiments may be performed in any logical order. Throughout the various views and illustrative embodiments, like reference numbers are used to designate like elements.

FIG. 1 illustrates an exemplary stud bump 2 having a bump region 6 and a tail region 8. Stud bump 2 is formed on electrical connector 4, which may be a bond pad, a metal line, an additional stud bump, or the like. Electrical connector 4 may further be a surface feature located at a surface of an integrated circuit component (not shown), which may be device die, a package substrate, an interposer, or the like. Bump region 6 has a height indicated as BH, tail region 8 has a height indicated as TH, and stud bump 2 has an overall height indicated as OH. Tail region 8 is at an upright position. In some embodiments, the tail region height TH can be in a range from about 15 µm to about 30 µm. In other embodiments, the tail region height TH can range from about 30 µm to about 100 µm. In yet other embodiments, the tail region height TH can be greater than about 100 µm, with an upper limit that approaches the length for gravity tilt (e.g., the point at which the tail region 8 can no longer support itself against the pull of gravity, which height varies depending upon the diameter of the tail region). Height OH may be greater than about 200 µm or greater than about 300 µm in some embodiments. Stud bump 2 may be formed of copper or gold in some embodiments, although other conductive materials such as aluminum, silver, platinum, palladium, tin, and the like are within the contemplated scope of embodiments.

FIGS. 2A through 2F illustrate an embodiment that allows for tail height control during a wire bonding stud bumping process. FIGS. 2A through 2F illustrate a substrate 10 with an electrical connector 12, such as a bond pad, a metal line, an additional stud bump, or the like, on the substrate 10. The substrate 10 can be an integrated circuit die, an organic substrate, a package substrate, a Printed Circuit Board (PCB), an interposer, or the like. A capillary 14 has a wire 18 passing therethrough. A clamp 16 is in a fixed relation with the capillary 14 subject to movement for applying a compressive force to and releasing the wire 18 and comprises a first plate 16a and a second plate 16b (collectively referred to as "clamp 16"). The clamp 16 is directly attached to a bond head (not shown) in this embodiment, but can be directly attached to the capillary 14 or can be attached to another component in other embodiments. The capillary 14 is also directly attached to the bond head in this embodiment, but can also be directly attached to another component.

A notcher 20 is on at least one of the first plate 16a or second plate 16b, and in the illustrated embodiment, the notcher 20 is on the second plate 16b. Although not explicitly depicted, but as will be discussed further below, at least one of the plates 16a and 16b can comprise at least one contact stopper. The clamp 16 comprises an actuator or some mechanical element that operates to move the plates 16a and 16b together to apply a compressive force on the wire 18 passing between the plates 16a and 16b and to move the plates 16a and 16b apart to release the wire 18. In an embodiment, the first plate 16a and the second plate 16b are moved in opposite directions perpendicular to an axis of the wire 18 passing between the plates 16a and 16b. As a result of movement of the plates 16a and 16b in a first of the opposite directions, a compressive force can be applied to the wire 18, and as a result of movement of the plates 16a and 16b in another of the opposite directions, the wire 18 can be released from the clamp 16. When the plates 16a and 16b of the clamp 16 apply a compressive force, such as illustrated by arrows 24, to the wire between the plates 16a and 16b, the notcher 20 forms a notch 22 in the wire 18, and the clamp 16 stabilizes and fastens the wire 18 through the capillary 14 during various process steps. As will be apparent from further discussion below, the wire 18 can have one or more notch 22 due to the repetitive and cyclical action of the capillary 14 and clamp 16 in forming multiple stud bumps.

The notcher 20 generally can be any feature that extends from a surface of at least one of the plates 16a and 16b that forms a notch 22 in a wire 18 intersected by the notcher 20 when the plates 16a and 16b are brought together. The notcher 20 is depicted as having a triangular cross section, such as with a triangular prism. In other embodiments, the notcher 20 can have a trapezoidal, semicircular, or the like cross section. The distance that the notcher 20 extends from the surface of the respective plate 16a or 16b should generally be less than the diameter of the wire 18 intended to be notched. For example, with a triangular cross section, the distance, e.g., height of the triangle, can be between approximately $1/5$ and $4/5$ of the diameter of the wire 18, and the width of the feature, e.g., base of the triangle along the surface of the plate 16a or 16b, can be less than approximately 4 times the height. In another example, with a trapezoidal cross section, the distance, e.g., height of the trapezoid, can be between approximately ¼ and ⅘ of the diameter of the wire 18. In yet another example, with a semicircular cross section, the distance, e.g., diameter of the semicircle, can between approximately ¼ and ¾ of the diameter of the wire 18.

In FIG. 2B, the capillary 14 positions the wire 18 over a location where the wire is to be bonded, such as over electrical connector 12. Energy 26, such as spark generated by an Electrical Flame Off (EFO) device, is applied to a free tip of the wire 18 protruding from the capillary 14. The energy 26 melts the free tip of the wire 18 into a ball 28, as shown in FIG. 2C.

Figure 2D:
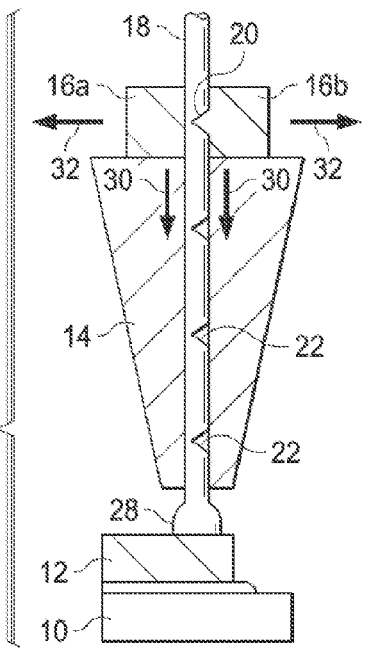

In FIG. 2D, the capillary 14 and clamp 16 move downward, as illustrated by arrows 30, towards electrical connector 12. The ball 28 is contacted with and bonded to the electrical connector 12. The bonding can use an applied downward pressure from the capillary 14 and clamp 16, an applied ultrasonic force applied by various components, such as a transducer on the capillary 14, and/or an applied heat from a surrounding environment. Once the ball 28 is bonded to the electrical connector 12, the clamp 16 releases the wire 18, as shown by arrows 32.

Figure 2E:
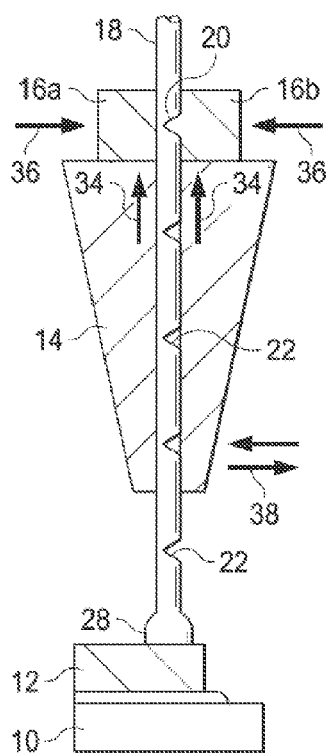

In FIG. 2E, the capillary 14 moves upwards, as illustrated by arrows 34, a distance where the clamp 16 again applies a compressive force, as shown by arrows 36, on the wire 18. The notcher 20 on the second plate 16b contacting the wire 18 in conjunction with the compressive force applied against the first plate 16a forms a new notch 22 in the wire 18 as a new length of wire is fed through the clamp 16 and capillary 14. As will be readily apparent to a person having ordinary skill in the art, the distance traversed along the wire 18 from the point at which the clamp 16 releases the wire 18 in FIG. 2D to the point at which the clamp applies the compressive force on the wire 18 in FIG. 2E, e.g., the pitch between notches 22, is the length of the wire 18 consumed in forming one stud bump. By controlling or altering this distance, such as during the bonding process, a tail height TH of the stud bump and the overall height OH can be controlled or altered. This process thus allows for simple modification of heights of stud bumps, such as within a package or between multiple packages.

Figure 2F:
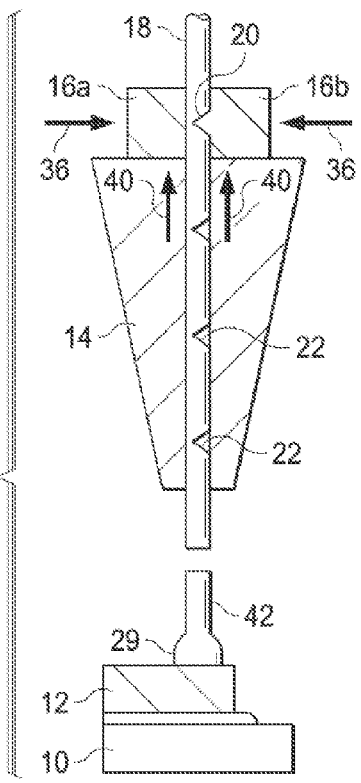

As those skilled in the art will appreciate, the wire 18 will be weaker, relative to un-notched regions, at the notches 22. Hence, when a force, such as a shearing force 38 in FIG. 2E, is applied, the wire may break at the lower-most notch 22. As shown in FIG. 2F, the broken wire 18 is clamped and lifted up relative to the electrical connector 12, as illustrated by arrows 40. A stud bump comprising the bump region 29 and a tail region 42 remains bonded to the electrical connector 12. The bump region 29 has a bump height BH, the tail region 42 has a tail height TH, and the stud bump has an overall height OH similar or the same as discussed above with respect to FIG. 1. Tail region 42, after being broken, may be upright. The capillary 14 may then step to another electrical connector and repeat the process shown in FIGS. 2A through 2F.

Figure 3A:
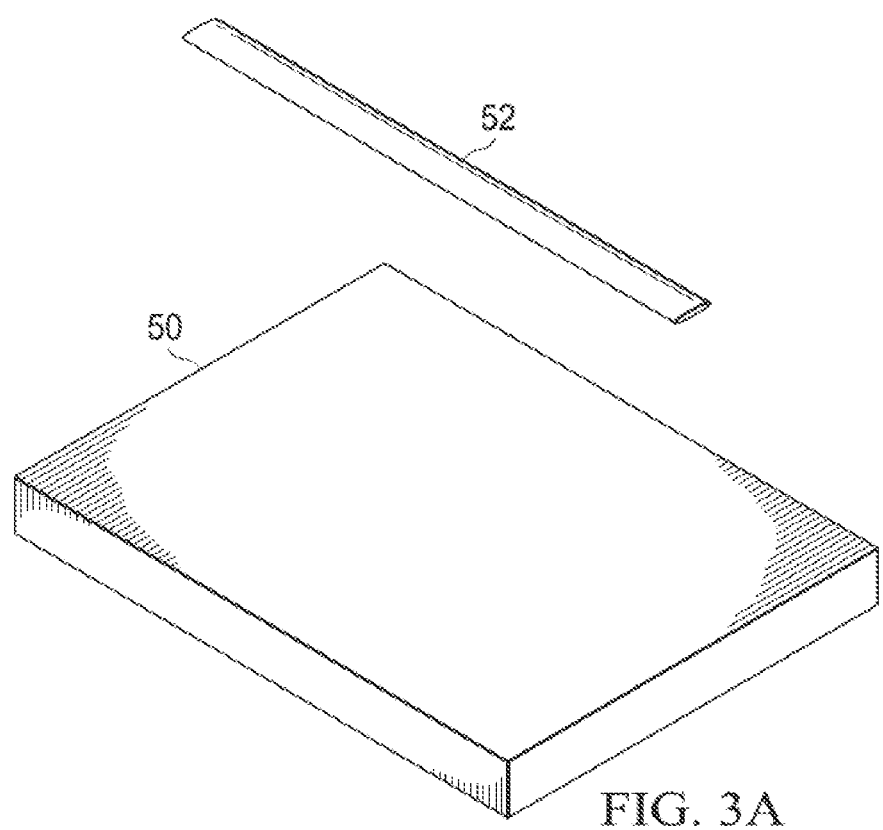
FIGS. 3A and 3B are a method of forming a plate with a notcher according to an embodiment.
Figure 3B:
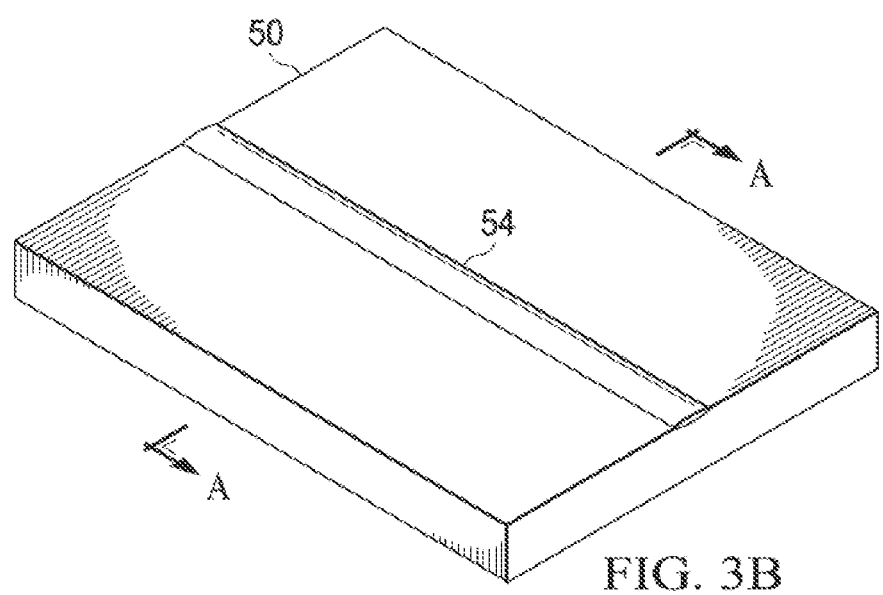
Figure 3C:
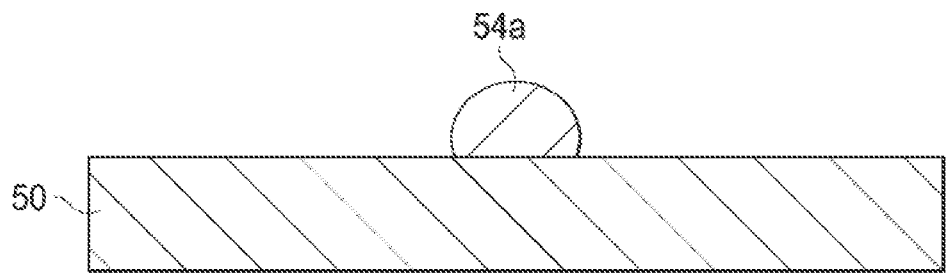
FIG. 3C is a plate and notcher formed by the process of FIGS. 3A and 3B where the rod is cylindrical.
Figure 3D:
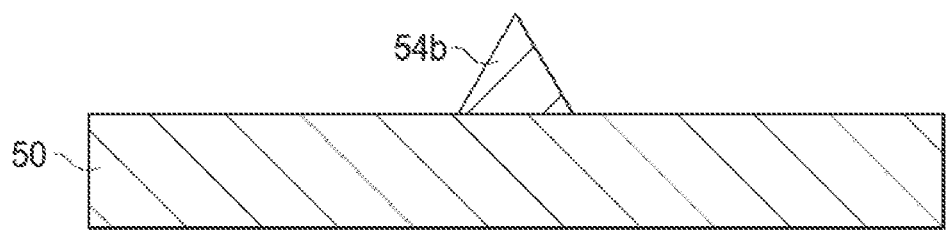
FIG. 3D is a plate and notcher formed by the process of FIGS. 3A and 3B where the rod is a rectangular base triangular prism.
Figure 3E:
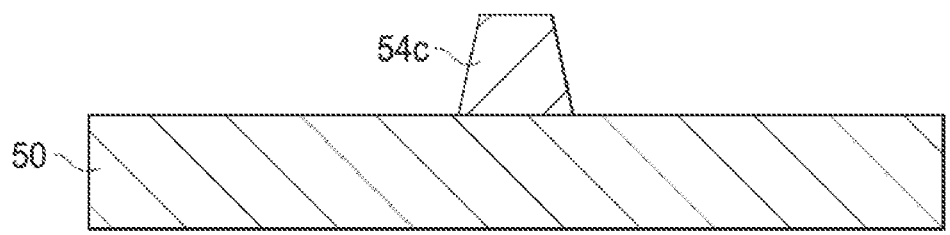
FIG. 3E is a plate and notcher formed by the process of FIGS. 3A and 3B where the rod is a rectangular base trapezoidal prism.

FIGS. 3A and 3B illustrate a method of forming a plate 50 with a notcher 54. FIG. 3A illustrates a plate 50, for example a metal plate such as tungsten carbine, and a rod 52, such as tungsten. The rod 52 is heated and placed on the plate 50. The heat and other appropriate forces melt and/or weld the rod 52 to the plate 50. The rod 52 is placed traversing the plate in a direction perpendicular to a direction of an axis of a wire passing through the clamp of which the plate 50 will be a part. The rod 52, as melted and/or welded to the plate 50, forms the notcher 54 on the plate 50, as illustrated in FIG. 3B. FIGS. 3C through 3E show cross-section views along cross-section A-A in FIG. 3B according to various embodiments. As shown in the cross-section of FIG. 3C, the rod 52 is cylindrical having a circular cross-section and thus forms a rounded notcher 54a on the plate 50. As shown in the cross-section of FIG. 3D, the rod 52 is a rectangular base triangular prism, e.g., a pentahedron, with a triangular cross-section, and thus forms a triangular notcher 54b on the plate 50. As shown in the cross-section of FIG. 3E, the rod 52 is a rectangular base trapezoidal prism, with a trapezoidal cross-section, and thus forms a trapezoidal notcher 54c on the plate 50. These notchers can have dimensions as previously discussed. It should be noted that one or more contact stoppers can be similarly formed on the plate 50 or an opposing plate. The opposing plate can have an opposing planar surface but may also comprise a contact stopper.

Figure 4A:
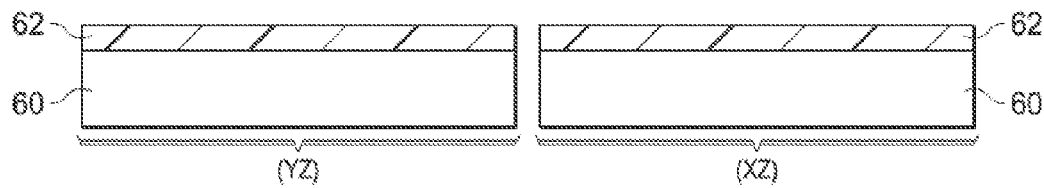
FIGS. 4A through 4H are another method of forming a plate with a notcher and contact stoppers according to an embodiment.

FIGS. 4A through 4H illustrate another method of forming a plate 80 with a notcher 82 and contact stoppers 84. FIG. 5 illustrates the plate 80 with the notcher 82 and contact stoppers 84 in a three-dimensional view, and FIGS. 4A through 4H illustrate two two-dimensional views, one along a YZ plane and another along the XZ plane according to the x-y-z axes illustrated in FIG. 5. FIG. 4A illustrates a sacrificial substrate 60 and a mask layer 62 over a surface of the sacrificial substrate 60. The sacrificial substrate 60 can be any suitable substrate, such as a bulk substrate and/or silicon, glass, silicon oxide, aluminum oxide, or the like. The mask layer 62 can be, for example, a nitride deposited by a low pressure chemical vapor deposition (LPCVD), or can be another suitable material formed by acceptable techniques.

Figure 4B:
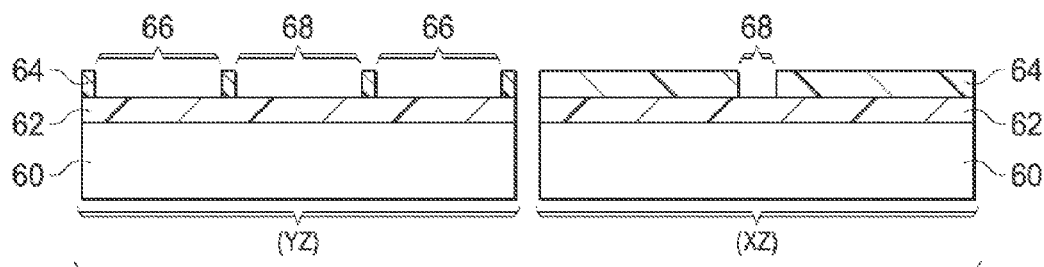
Figure 4C:
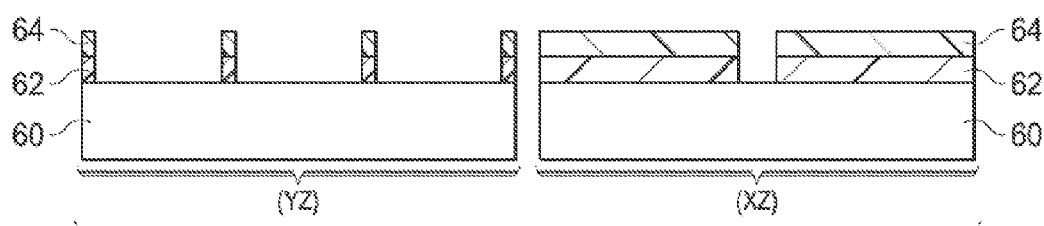
Figure 4D:
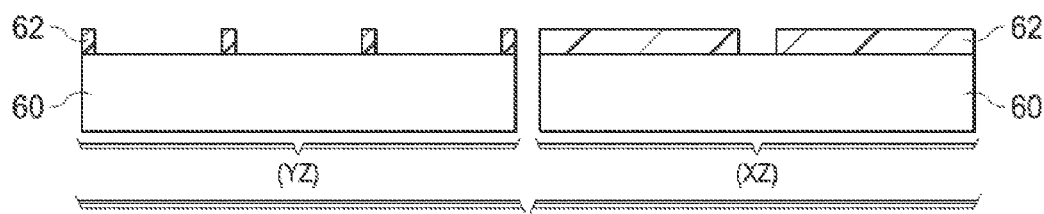
Figure 5:
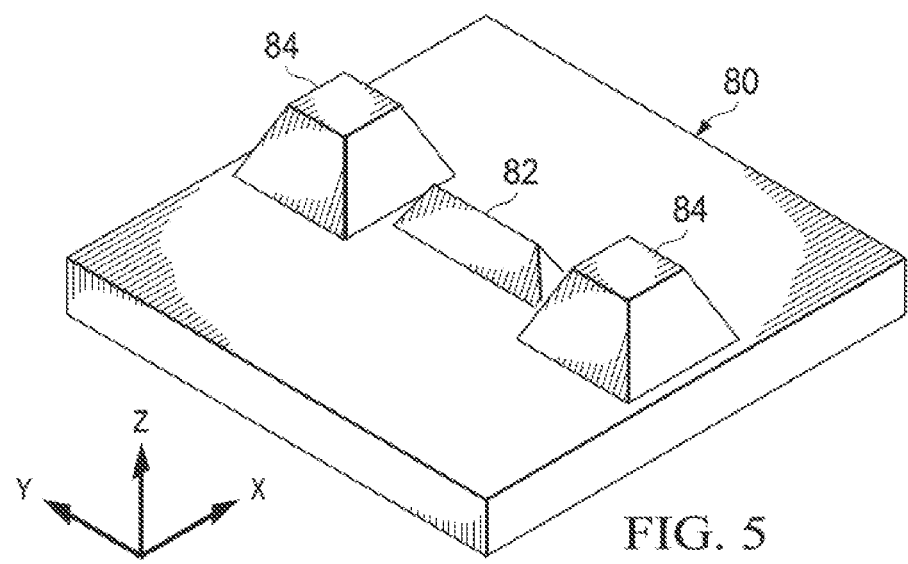
FIG. 5 illustrates the plate with the notcher and contact stoppers formed by FIGS. 4A through 4H in a three-dimensional view.

In FIG. 4B, a photoresist 64 is formed on the mask layer 62 and patterned according to acceptable photolithography techniques. Openings 66 in the patterned photoresist 64 may generally correspond to the contact stoppers 84 that will be formed on the plate 80, and opening 68 may generally correspond to the notcher 82. In FIG. 4C, the pattern of the photoresist 64 is transferred to the mask layer 62 using, for example, an acceptable etch process, such as a reactive ion etch (RIE). In FIG. 4D, the photoresist 64 is removed using, for example, an ash and/or flush process.

Figure 4E:
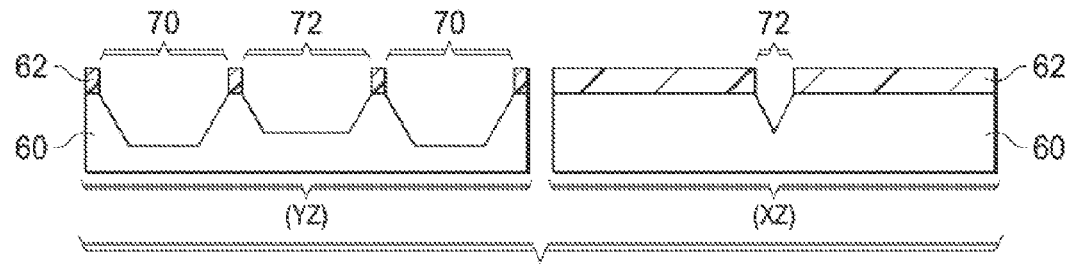
Figure 4F:
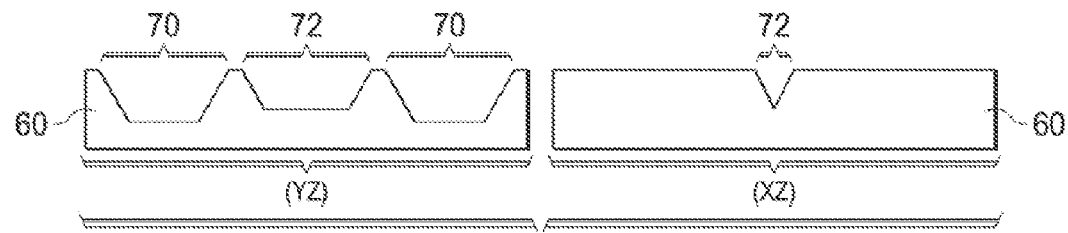

In FIG. 4E, an etching process is carried out to etch recesses 70 and 72 in the sacrificial substrate 60. Recesses 70 may generally correspond to the contact stoppers 84 that will be formed on the plate 80, and recess 72 may generally correspond to the notcher 82. In this example, the etching process is a KOH anisotropic etch, although other embodiments contemplate other suitable etch processes. In FIG. 4F, the mask layer 62 is removed, for example, using an etch process selective to the mask layer 62. In this example, this etch process is a $H_3PO_4$ wet etch, although other embodiments contemplate other suitable etch processes.

Figure 4G:
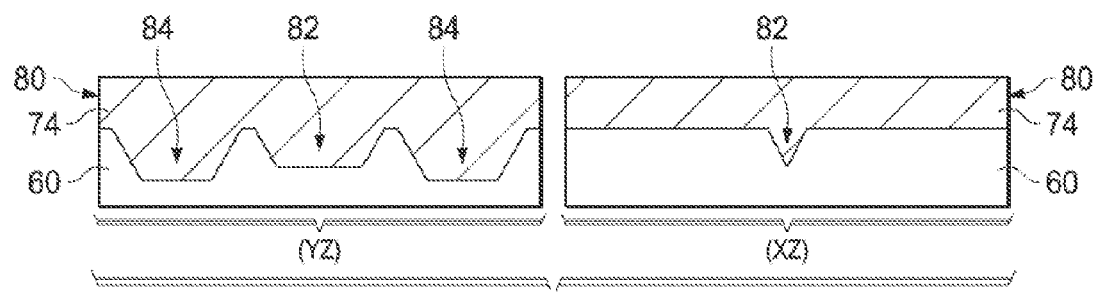
Figure 4H:
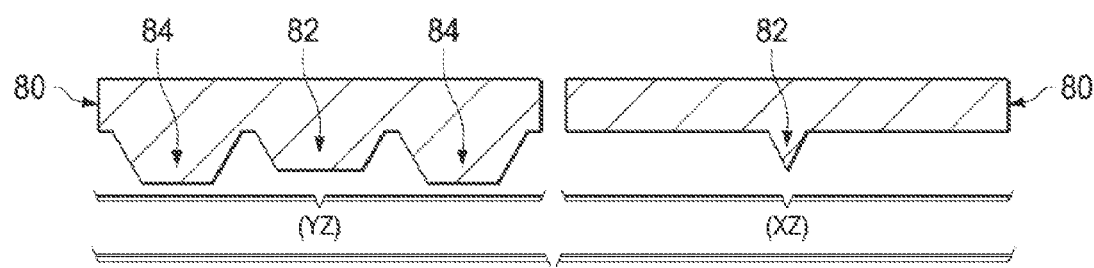

In FIG. 4G, a metal 74 is deposited on the sacrificial substrate 60 and into the recesses 70 and 72. The metal 74 may be nickel chromium, the like, or a combination thereof, and may be deposited by a chemical vapor deposition (CVD), atomic layer deposition (ALD), physical vapor deposition (PVD), the like, or a combination thereof. The metal 74 forms the plate 80 with the notcher 82 and contact stoppers 84. The notcher 82 is formed by depositing the metal 74 in the recess 72, and the contact stoppers 84 are formed by depositing the metal 74 in the recesses 70. In FIG. 4H, the sacrificial substrate 60 is removed, for example, by an etch, leaving the plate 80 with the notcher 82 and contact stoppers 84, which is shown in a three-dimensional view in FIG. 5.

In this example, the notcher 82 has a triangular cross-section and is substantially a triangular prism. The contact stoppers 84 are each substantially a pyramidal frustum. Other embodiments contemplate various geometries for the notcher and/or contact stoppers, such as discussed above, and number of contact stoppers, such as having none or more than two. These geometries can be altered by altering, for example, the pattern of the mask and/or the etch process for etching the sacrificial substrate to form the recesses in which the notcher and contact stoppers will be formed.

Figure 6A:
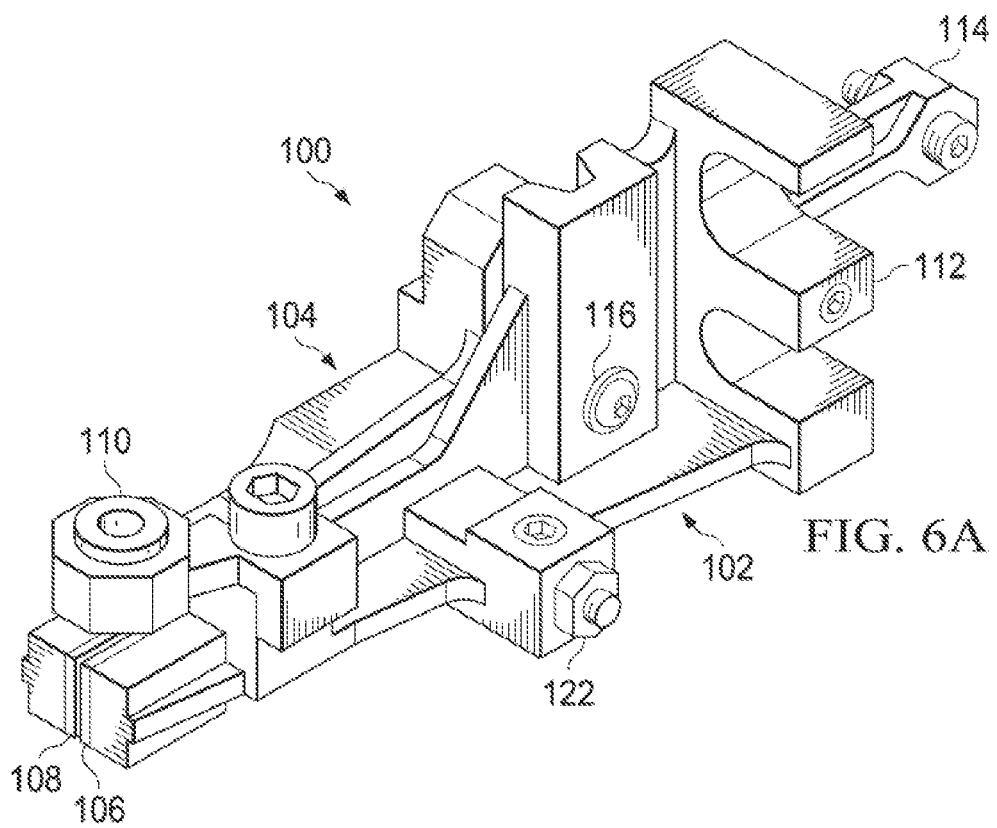
FIGS. 6A and 6B are views of a clamp according to an embodiment.
Figure 6B:
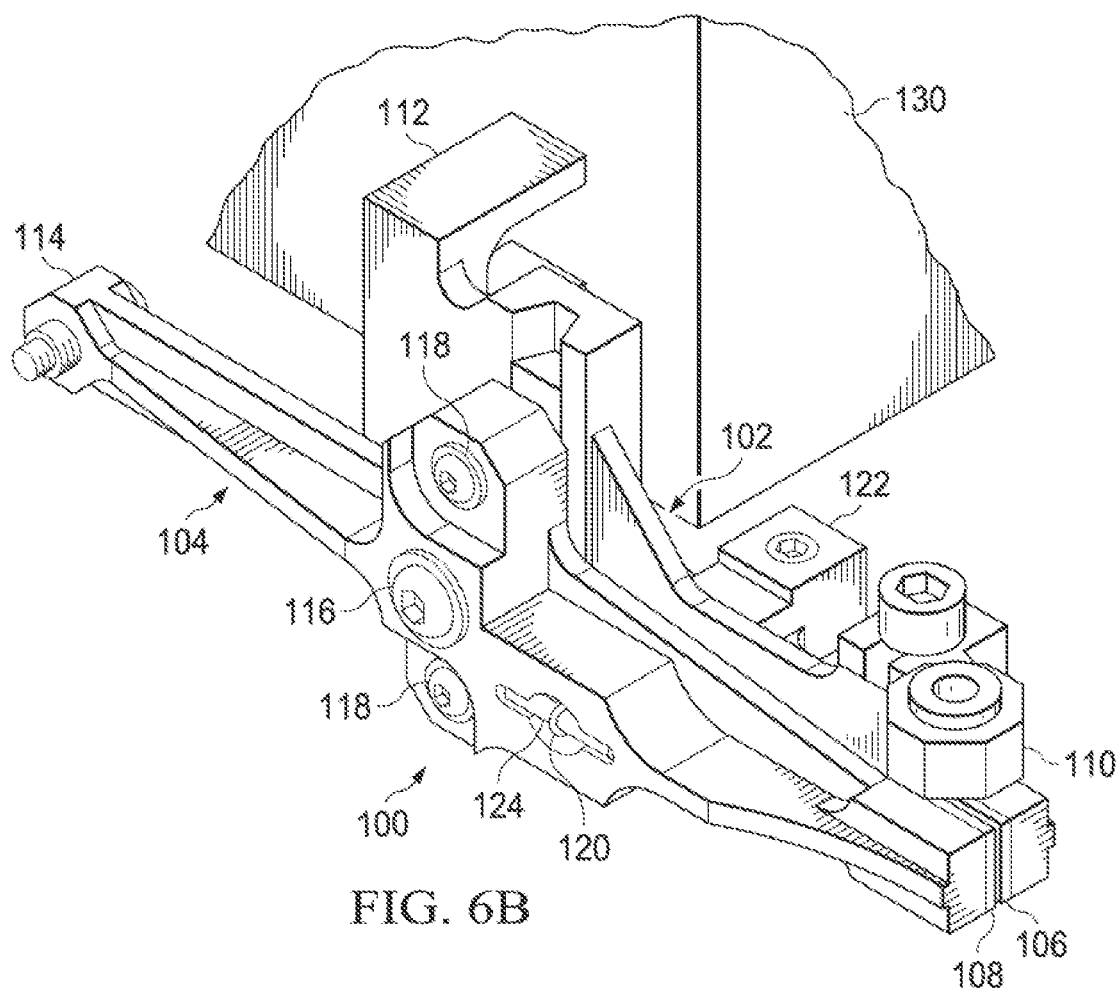

FIGS. 6A and 6B are different views of an example clamp 100. The clamp 100 comprises a fixed jaw 102 and an articulating jaw 104. Each of the jaws 102 and 104 comprises a plate 106 and 108, respectively, that is used to clamp a wire during a bonding process, such as described above. At least one of the plates 106 and 108 comprises a notcher (not illustrated), such as described above. At least one of the plates 106 and 108 may also comprise one or more contact stopper, as also described above. The plates 106 and 108 can be formed as previously discussed. A wire guide 110 is on the fixed jaw 102 and guides wires between the plates 106 and 108 when the clamp 100 is in use. The fixed jaw 102 also comprises a bracket 112 that is used to fix the fixed jaw 102 to a bond head 130 (illustrated in FIG. 6B) for use during a bonding process, such as shown above with respect to FIGS. 2A through 2F. The articulating jaw 104 comprises an articulating arm 114 that is connected to an actuator for use during a bonding process.

The articulating jaw 104 is attached to the fixed jaw 102 proximate an articulating axis. A securing mechanism 116, such as a screw, is threaded through the articulating jaw 104 and the fixed jaw 102 and loosely attaches the articulating jaw 104 to the fixed jaw 102. Two pins 118 are threaded through the articulating jaw 104 and rest in respective grooved jewels in the fixed jaw 102. The points at which the pins 118 contact the grooved jewels are pivots around which the articulating jaw 104 articulates. In operation, when the actuator attached to the articulating arm 114 initiates movement of the articulating arm 114 towards the fixed jaw 102, the articulating jaw 104 rotates slightly about the fulcrum created by the pins 118 in the grooved jewels. This increases a distance between the plates 106 and 108, and releases, for example, a wire used during a bonding process.

A spring 120 is through the fixed jaw 102 and the articulating jaw 104. The spring 120 is anchored to the fixed jaw 102 using a spring anchor 122, for example, a bolt and nut. In an embodiment, the bolt and nut may be tightened or loosened to increase or decrease the tension of the spring. A pin 124 through the spring and resting in a groove secures the spring 120 to the articulating jaw 104. In operation, when the actuator attached to the articulating arm 114 releases, the spring 120 supplies a compressive force moving the articulating jaw 104 around the fulcrum created by the pins 118 in the grooved jewels and applies a compressive force between the plates 106 and 108 to clamp, for example, a wire used during a bonding process. This clamping action used in conjunction with a plate with a notcher can create a notch in a wire used during a bonding process. Various modifications can be made to the clamp 100, which are also contemplated within the scope of embodiments. For example, the placement and configuration of various components may be changed or altered, and some components may be omitted.

According to an embodiment, a method includes clamping a wire with a clamp. The clamp includes at least two opposing plates, and at least one of the opposing plates includes a protruding feature that intersects the wire when the wire is clamped forming a first notch in the wire. The method further includes bonding the wire to a bonding surface, releasing the wire from the clamp, passing the wire a notch pitch distance through the clamp, clamping the wire with the clamp forming a second notch in the wire, and breaking the wire leaving a bonded portion of the wire on the bonding surface. The second notch is the notch pitch distance from the first notch along the wire.

According to a further embodiment, a method includes securing a wire relative to a capillary using a clamp. The clamp includes at least two opposing plates, and at least one of the opposing plates includes a notcher contacting the wire when the wire is secured to form a first notch in the wire. The method further includes bonding the secured wire to a bonding surface to form a bonded wire, allowing a notch pitch distance of the bonded wire to pass through the clamp, and securing the bonded wire using the clamp. The notcher contacts the bonded wire to form a second notch in the bonded wire, and the second notch is the notch pitch distance from the first notch along the bonded wire.

A yet further embodiment is a bonder including a clamp and a bond head. The clamp is attached to the bond head. The clamp includes a first component and a second component. The first component comprises a first plate with a first surface, and the second component comprises a second plate with a second surface. The second surface opposes the first surface, and at least one of the first surface and the second surface comprises a protruding notcher. The second component is coupled to the first component. The second component is capable of articulating about a pivot on the first component to move the second surface closer to the first surface or to move the second surface further from the first surface. The first surface and the second surface are capable of clamping a wire and forming a notch in the wire using the protruding notcher when the first surface and the second surface are brought together.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
providing a clamp comprising a first clamp plate comprising a clamping surface;
providing a rod;
forming a notcher on the clamping surface, the forming comprising welding the rod to the clamping surface, the notcher configured to form a notch in a wire;
forming a first contact stopper on the clamping surface; and
connecting a wire guide to the clamp, the wire guide comprising a cylindrical opening, an axis of the cylindrical opening extending through an opening of the clamp.

2. The method of claim 1, further comprising attaching the first clamp plate to the clamp, the clamping surface of the first clamp plate opposing a second clamp plate.

3. The method of claim 1, wherein the notcher comprises a triangular cross section.

4. The method of claim 1, wherein the notcher comprises a trapezoidal cross section.

5. The method of claim 1, wherein the notcher comprises a semicircular cross section.

6. The method of claim 1, wherein the first clamp plate is tungsten carbide, and the rod is tungsten.

7. A method, comprising:
providing a clamp including a first clamp plate comprising a planar clamping surface;
providing a rod;
attaching the rod to and traversing the planar clamping surface to form a notcher protruding from the planar clamping surface, the notcher configured to form a notch in a wire;
forming a contact stopper on the planar clamping surface, the contact stopper protruding from the planar clamping surface further than the notcher protrudes from the planar clamping surface; and
connecting a guide to the clamp, the guide comprising a circular opening, the guide positioned in a manner that a straight line extending through an opening of the clamp passes through the circular opening.

8. The method of claim 7, wherein the attaching comprises welding the rod to the first clamp plate.

9. The method of claim 7, wherein the attaching comprises melting the rod to the first clamp plate.

10. The method of claim 7, further comprising attaching the first clamp plate to the clamp, the planar clamping surface of the first clamp plate opposing a second clamp plate.

11. The method of claim 7, wherein the rod comprises a triangular cross section.

12. The method of claim 7, wherein the rod comprises a trapezoidal cross section.

13. The method of claim 7, wherein the rod comprises at least a semicircular cross section.

14. The method of claim 7, wherein the first clamp plate is tungsten carbide, and the rod is tungsten.

15. A method, comprising:
providing a clamp comprising a first clamp plate comprising a planar clamping surface;
providing a rod;
forming a notcher on the planar clamping surface, the notcher configured to form a notch in a wire, by welding and/or melting the rod on the planar clamping surface of the first clamp plate, a longitudinal axis of the rod, as welded and/or melted on the planar clamping surface, traversing along at least a portion of the planar clamping surface, the notcher extending from the planar clamping surface;
forming a first contact stopper on the planar clamping surface, the first contact stopper protruding from the planar clamping surface further than the notcher protrudes from the planar clamping surface; and
connecting a wire guide to the clamp, the wire guide comprising an aperture, the wire guide positioned in a manner that a straight line extending from the notcher to the wire guide passes through the aperture.

16. The method of claim 15, further comprising attaching the first clamp plate to the clamp, the planar clamping surface of the first clamp plate opposing a second clamp plate.

17. The method of claim 15, wherein a cross section of the notcher is triangular, trapezoidal, or at least semi-circular, the cross section intersecting the longitudinal axis of the rod.

18. The method of claim 1, further comprising forming a second contact stopper on the clamping surface, the notcher positioned between the first contact stopper and the second contact stopper.

19. The method of claim 7, further comprising forming a second contact stopper on the planar clamping surface.

20. The method of claim 15, further comprising forming a second contact stopper on the planar clamping surface, the notcher positioned between the first contact stopper and the second contact stopper.

* * * * *